United States Patent [19]

Iwahashi et al.

[11] 4,247,918
[45] Jan. 27, 1981

[54] ELECTRICALLY ALTERABLE NONVOLATILE MEMORY

[75] Inventors: Hiroshi Iwahashi, Yokohama; Shoji Ariizumi, Tokyo, both of Japan

[73] Assignee: Tokyo Shibaura Denki Kabushiki Kaisha, Japan

[21] Appl. No.: 72,938

[22] Filed: Sep. 6, 1979

[30] Foreign Application Priority Data

Sep. 14, 1978 [JP] Japan .................. 53-113344

[51] Int. Cl.³ .................................. G11C 11/40
[52] U.S. Cl. ........................ 365/218; 365/182; 365/185; 307/238
[58] Field of Search ............ 365/182, 184, 185, 186, 365/189, 218; 307/238, 279

[56] References Cited

U.S. PATENT DOCUMENTS 4,172,291  10/1979  Owens .......................... 365/218

Primary Examiner—Terrell W. Fears
Attorney, Agent, or Firm—Finnegan, Henderson, Farabow, Garrett & Dunner

[57] ABSTRACT

An electrically erasable nonvolatile memory system comprises nonvolatile memory cells each including one transistor. A plurality of row lines are connected commonly to the control gates of the memory cells arranged in a row direction, respectively. For applying a positive voltage to a selected row line upon data-write or data-read and a negative voltage to a selected row line upon data-erase, a plurality of control circuits are provided. Each control circuit is coupled with a corresponding one of the row lines, with one of outputs of a row decoder selecting a row line and with a control terminal which is commonly coupled to the control circuits. Each control circuit is so constructed as to supply to a corresponding row line with a voltage having a prescribed level corresponding to a voltage level applied to the control terminal.

15 Claims, 24 Drawing Figures

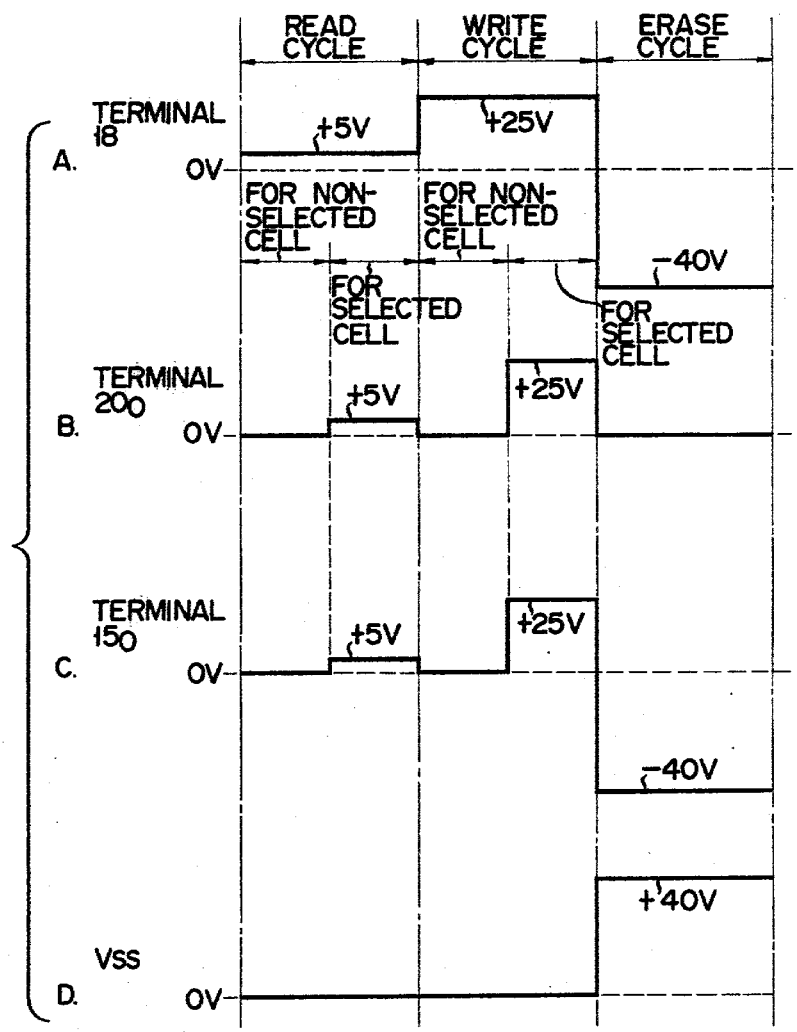

ELECTRICALLY ALTERABLE NONVOLATILE MEMORY

BACKGROUND OF THE INVENTION

The invention relates to a nonvolatile memory system allowing data to electrically be written or erased.

An erasable and programmable read only memory (EP-ROM) system, known to those skilled in the art, employs a floating gate type FET (field effect transistor) or an MNOS (metal nitride oxide semiconductor) type FET for its memory cell. It is also known that in a memory system using memory cells of the floating gate type, there are two known erasing methods to erase the contents of the memory cells; one for illuminating the contents of memory cells by ultraviolet rays and the other for electrically erasing the contents of the memory cells. The ultraviolet erasing method is advantageous in that a smaller number of transistors constituting memory cells are needed, but is disadvantageous in that a longer time is taken for erasing the memory contents. In this respect, it is desirable to employ the electrical erasing method.

A conventional electrically alterable nonvolatile memory system employing the electrical erasing method will briefly be described with reference to FIG. 1. As shown, unit memory cells Iao, Ia1, ... and Ibo, Ib1, ... are arranged in columns of a matrix array while unit memory cells Iao, Ibo, ..., and Ia1, Ib1, ... are arranged in rows. Each memory cell, for example, Iao, is comprised of a series circuit including an MOS-FET 2 and a floating gate type FET 3. For writing data into the memory cell, a voltage applied to the control gate of the floating type FET 3 must be opposite in polarity to that of a voltage applied to the same for erasing data stored in the memory cell. To this end, the control gate FET 3 must electrically be insulated from the substrate in a memory system design. In the circuit construction shown, the control gate of FET 3 can not be used when the memory system is decoded. To avoid this, the FET 2 is connected in series to the FET 3. In the memory cell selection, the memory cell Iao in this example is selected by driving a column line 4a to which a MOS FET 5a is connected in series; and by driving a row line 6ao connected to the gate of the MOS FET 2. The control gate of the floating gate type FET 3 is connected to a control line 6b.

FIG. 2 shows a cross sectional view of a unit memory cell. As mentioned above, the ultraviolet ray erasing method needs only one transistor for the unit memory cell while the electrical erasing method needs a couple of transistors 2 and 3, as shown in FIGS. 1 and 2.

Accordingly, an object of the invention is to provide an electrically alterable nonvolatile memory system of a type in which the contents of memory cells are electrically erasable and each memory cell is comprised of a single transistor.

SUMMARY OF THE INVENTION

According to the invention, there is provided an electrically alterable nonvolatile memory system comprising: a plurality of nonvolatile memory cells arranged in a matrix array and each including one transistor; a plurality of column lines coupled with one of the ends of the source-drain paths of the memory cells arranged in a column direction; a voltage supply source coupled commonly with the other ends of the source-drain paths; a column decoder coupled with the column lines for selecting a column line; a plurality of row lines each connected commonly to the control gates of the memory cells arranged in a row direction; a row decoder coupled with the row lines for selecting a row line; a control terminal coupled commonly to the respective row lines for applying a voltage with a different level corresponding to data-read, data-write or data-erase of at least one of the memory cells; and a plurality of control circuits each being coupled with a corresponding one of the row lines, with one of output terminals of the row decoder corresponding to the corresponding row line and with the control terminal, for applying to a corresponding row line with a voltage having a prescribed level corresponding to a voltage level applied to the control terminal. With such a construction, the data-write, data-read or data-erase is made for at least one of the memory cells by controlling at least the voltage applied to the control terminal.

The nonvolatile memory system according to the invention has memory cells each including one transistor so that the number of transistors used in the memory system is small. Further, data in the memory cells are electrically erasable, so that the erasing time of the memory data can be shortened.

Other objects and features of the invention will be apparent from the following description taken in connection with the accompanying drawings, in which:

BRIEF DESCRIPTION OF THE DRAWINGS

FIG. 6 shows waveforms of signals applied in read, write and erase cycles;

DETAILED DESCRIPTION OF THE PREFERRED EMBODIMENTS

For ease of understanding the invention, the writing, reading and erasure of data will first be described by using a memory cell having a floating gate type FET. A term "data-write" in the specification means that a positive voltage is applied to the control gate of the FET in the memory cell and the drain thereof to cause current to flow through the channel and to cause impact ionization in the vicinity of the drain, thereby to inject electrons into the floating gate of the FET. A term "data-read" means to detect electrons injected into the floating gate. A term "data-erase" means that a negative voltage is applied to the control gate of the FET to cause a breakdown between the drain or source and the substrate of the FET to inject holes into the floating gate thereby to neutralize the electrons already injected or written thereinto.

Figure 1:
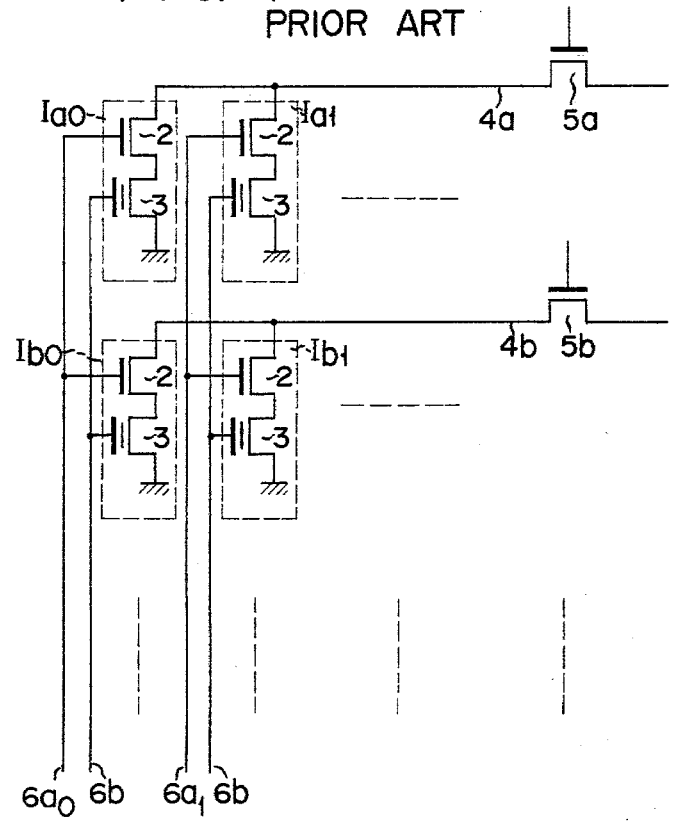
FIG. 1 shows a part of the circuit diagram of a conventional electrically alterable nonvolatile memory system.
Figure 2:
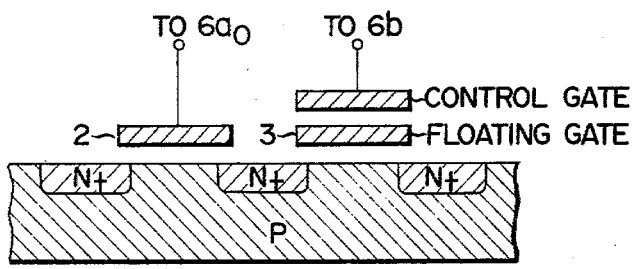
FIG. 2 shows a cross sectional view of a unit memory cell shown in FIG. 1.
Figure 3:
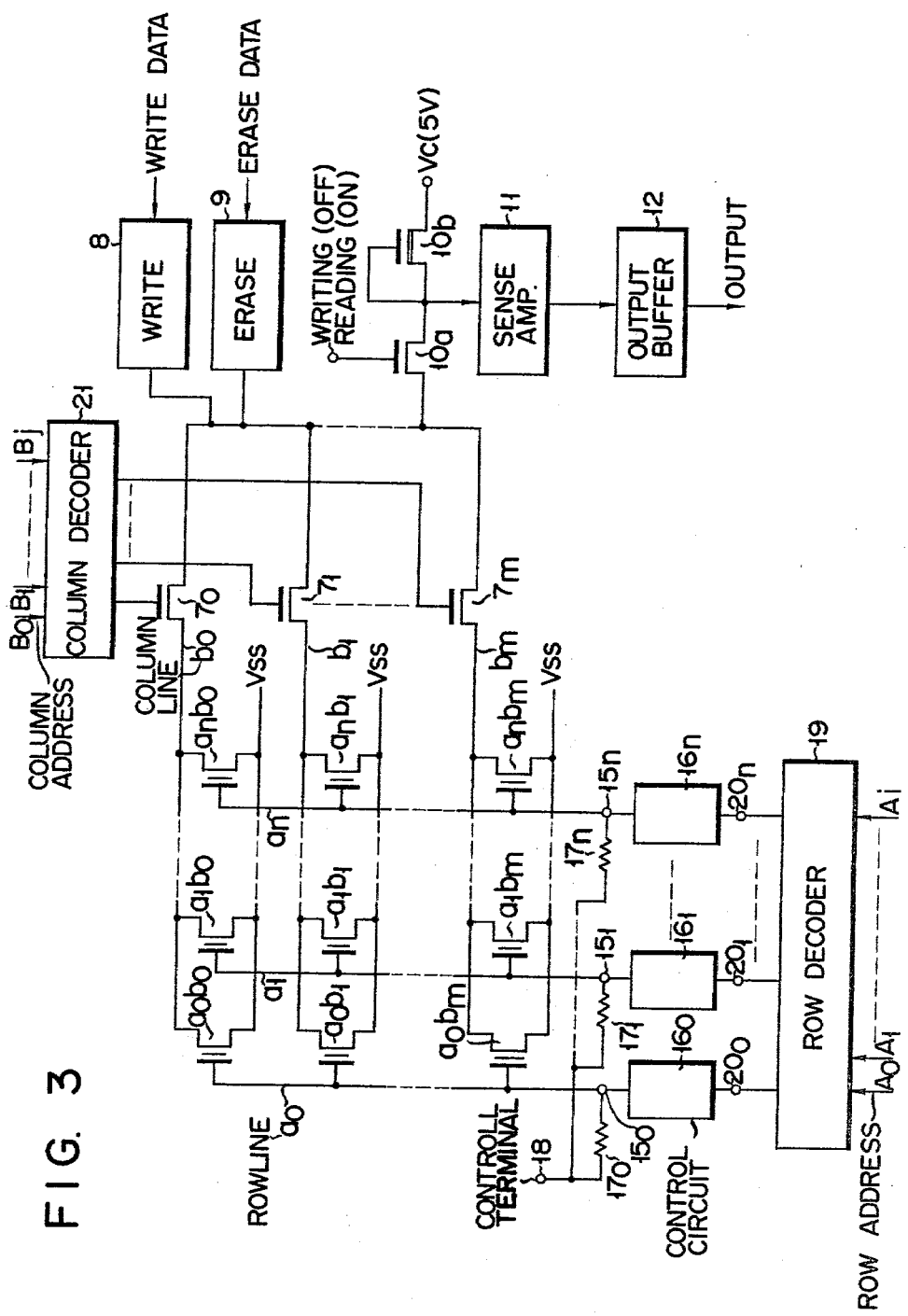
FIG. 3 shows a block diagram of one embodiment of an electrically alterable nonvolatile memory system according to the invention.

An embodiment of an electrically alterable non-volatile memory will be described with reference to FIG. 3. In FIG. 3, floating gate type FETs (referred to as FGTr) $a_0b_0, \ldots a_nb_0; a_0b_1, \ldots a_nb_1; a_0b_m, a_nb_m$ constitute memory cells, respectively. FGTr's $a_0b_0, \ldots a_nb_0$ have source-drain paths connected between one column line $b_0$ and a power supply source Vss (normally ground potential). FGTr's $a_0b_1, \ldots a_nb_1$ have source-drain paths connected between a column line $b_1$ and the power supply source Vss. FGTr's $a_0b_m, \ldots a_nb_m$ source-drain paths connected between a column line $b_m$ and the power supply source Vss. The respective column lines $b_0$ to $b_m$ are commonly connected to each other through transistors $7_0$ to $7_m$. A write control circuit 8, an erase control circuit 9, and a couple of transistors 10a and 10b are connected in a cluster to a common connection point of column lines $b_0$–$b_m$. The connection point between transistors 10a and 10b is connected to the input of a sense amplifier 11 which is further connected at the output to an output buffer 12 for producing a read output. FGTr's $a_0b_0, \ldots a_0b_m$ are connected at the gates to a row line $a_0$; FGTr's $a_1b_0, \ldots a_1b_m$ are connected at the gates to a row line $a_1$; FGTr's $a_nb_0, \ldots a_nb_m$ at the gates to a row line $a_n$. The row lines $a_0$ to $a_n$ are connected through terminals $15_0$ to $15_n$ to control circuits $16_0$ to $16_n$, respectively. The terminals $15_0$ to $15_n$ are connected through corresponding resistors $17_0$ to $17_n$ to a control terminal 18. A row decoder 19, which receives at the inputs row addresses $A_0$ to $A_{in}$, produces outputs which in turn are applied through terminals $20_0, \ldots 20_n$ to the control circuits $16_0, \ldots 16_n$. A column decoder 21, which receives at the inputs column addresses $B_0, \ldots B_j$, produces output signals for application to the gates of the transistors $7_0, \ldots 7_m$.

Figure 4A:
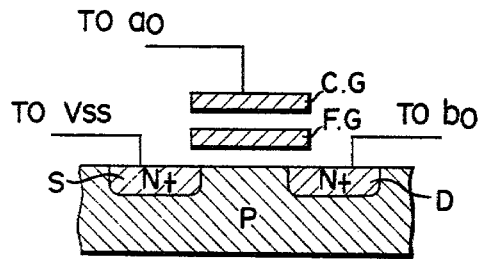
FIG. 4A shows a cross sectional view of an example of the memory cells shown in FIG. 3.
Figure 4C:
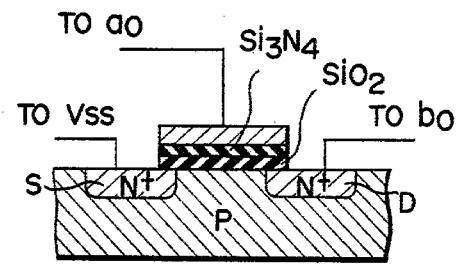
FIGS. 4B and 4C show cross sectional views of other examples of memory cells used in the memory system according to the invention.

A structure of one memory cell, for example $a_0b_0$, is illustrated in FIG. 4A. As shown, a drain D (N+) formed on the surface portion of a substrate of P type is connected to a column line $b_0$. A source S (N+) similarly formed is connected to the power supply source Vss. A control gate CG, disposed above the floating gate FG, is connected to the row line $a_0$.

Figure 5A:
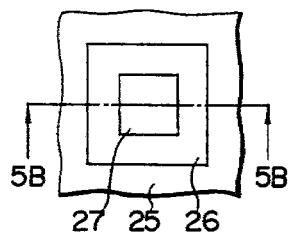
FIGS. 5A to 5C show a plan view, a cross sectional view (taken along line 5B—5B in FIG. 5A) and an equivalent circuit of a semiconductor element forming a control circuit shown in FIG. 3.
Figure 5B:
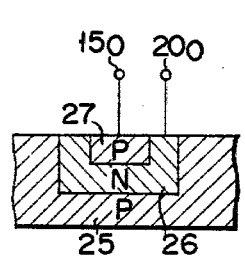
Figure 5C:
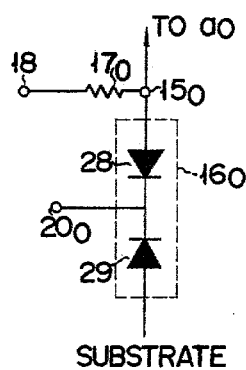

The structural and schematic illustrations of one control circuit, for example $16_0$ shown in FIG. 3 are shown in FIGS. 5A to 5C. In those figures, FIG. 5A shows a plan view, FIG. 5B shows a cross sectional view taken along line 5B—5B in FIG. 5A, and FIG. 5C shows an equivalent circuit of the structure shown in FIGS. 5A and 5B. As shown, a surface area 26 of N type is formed on the same substrate 25 as that of the memory cells. Another surface area 27 of P conductivity type is formed on a part of the surface area 26. In this structure, a diode between the terminals $15_0$ and $20_0$ is designated by reference numeral 28 and a diode between the terminal $20_0$ and the substrate 25 is designated by numeral 29.

The operation of the memory system shown in FIG. 3 will be described. In writing data into a memory cell $a_0b_0$, for example, the column decoder 21 applies a selection signal, for example, +25 V, to the gate of the transistor $7_0$ to render the transistor $7_0$ conductive thereby to select the column line $b_0$. At this time, a write voltage, for example, +25 V, is applied to the control terminal 18. Further, the row decoder 19 applies a selection signal of +25 V, for example, to the terminal $20_0$. In this case, the selection signal at the terminal $20_0$ is logical '1'. Since the potential +25 V is applied to the terminals $20_0$ and $15_0$, the diode 28 is rendered OFF state, as seen from FIG. 5C. Accordingly, the voltage +25 V applied to the terminal 18 is applied to the row line $a_0$ by way of the resistor $17_0$ so that the row line $a_0$ is kept at +25 V. Because of the turn-on of the transistor $7_0$, the write circuit 8 applies +20 V through the column line $b_0$ to the drain D of the cell $a_0b_0$. Accordingly, impact ionization takes place between the drain and source of the cell $a_0b_0$ and electrons are injected into the floating gate FG. At this point, the write operation is completed. With respect to the memory cells $a_0b_1, \ldots a_0b_m$, the write voltage of +25 V from the control terminal 18 is applied to the control gates of those cells. However, since the transistor $7_1$ to $7_m$ are in OFF state, no write operation is performed into those transistors. If the voltage of the terminal $20_0$ is logical '0', a forward bias is applied to the diode 28, so that discharge current flows through the control terminal 18, the resistor $17_0$, the terminal $15_0$ and the row decoder 19 and the terminal $15_0$ has a potential of logical '0' (approximately 0 V). Therefore, nothing is written into the memory cell $a_0b_0$, even if the column line $b_0$ is selected. In other words, when the memory cell $a_0b_0$ is selected, the terminals $20_1, \ldots 20_n$ are at logical '0' and hence nothing is written into the memory cells $a_1b_0, \ldots a_nb_0$, even if the column line $b_0$ is selected.

In reading out data stored in the memory cell $a_0b_0$, a read signal of +5 V, for example, is applied to the control terminal 18. A selection signal '1' of, for example, +5 V, for a row line $a_0$ is applied to the terminal $20_0$. Further, a selection signal for a column line $b_0$ is applied to the gate of the transistor $7_0$. In this case, the diodes 28 and 29 in FIG. 5C are both biased reversely. Accordingly, the row line $a_0$ connected to the control terminal 18 is kept at +5 V while the remaining row lines $a_1$ to $a_n$ are at 0 V. The memory cell having electrons injected in the floating gate, that is, having data written, does not conduct even when +5 V is applied to the control gate CG. However, the memory cell having no data written conducts in such a case. Accordingly, data stored in the memory cell $a_ob_o$ is detected by the sense amplifier 11 as a change of the potential on the column line $b_o$, and then is read out through the output buffer 12.

In erasing the memory cell $a_ob_o$, for example, having data stored, −40 V, for example, is applied to the control terminal 18 while the voltage of the power supply source Vss is set to +40 V. At this time, since the diode 28 (FIG. 5C) is inversely biased, the −40 V applied to the terminal 18 is applied to the control gates of all the memory cells. By setting the power supply source Vss to +40 V, that is, applying +40 V to the source of the transistor shown in FIG. 4A, break down takes place under the floating gates FG of all the memory cells to produce pairs of electrons and holes. As a result, holes are injected into the floating gate FG of all the cells. At this point, the erasing operation ends.

FIG. 6 shows voltages applied to the terminals 18 and $20_o$ (including $20_1, \ldots 20_n$) and the terminal $15_o$ (including $15_1, \ldots 15_n$) and the voltage of the power supply source Vss in the read, write, and erase cycles in FIG. 3. In the read and write cycles, the selected cell and the non-selected cell are separately illustrated.

Figure 7A:
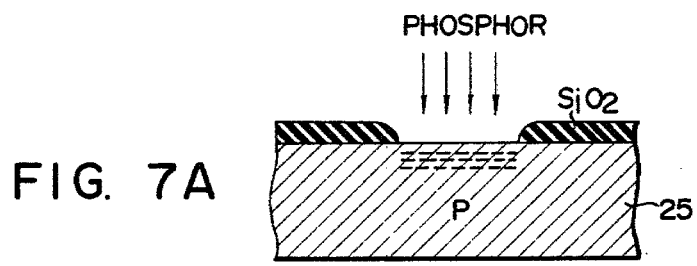
FIGS. 7A to 7C show cross sectional views illustrating an example of a manufacturing process of the semiconductor shown in FIG. 5B.
Figure 7B:
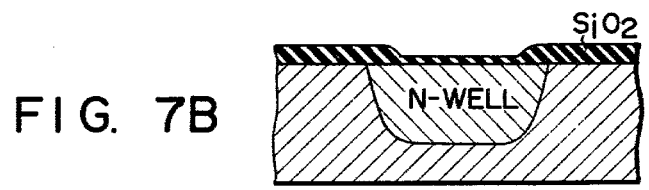
Figure 7C:
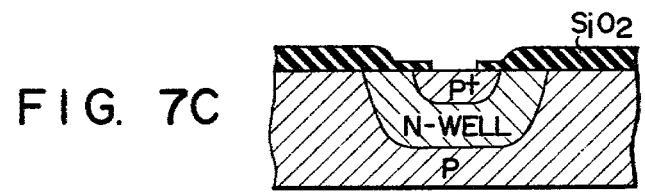
Figure 8A:
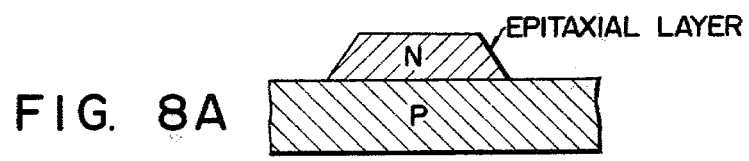
FIGS. 8A to 8B show cross sectional views illustrating another manufacturing process of the semiconductor element shown in FIG. 5B.
Figure 8B:
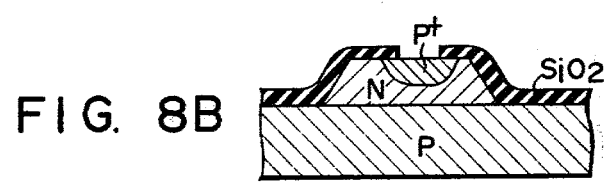

A manufacturing method of the control circuit (diode circuit) shown in FIG. 5B will be described with reference to FIGS. 7A to 7C, and FIGS. 8A and 8B. Approximately $5 \times 10^{12}$ cm$^{-2}$ of phosphor are implanted into the P type substrate with an impurity concentration of $N_A$ (acceptor concentration) = $2 \times 10^{15}$ cm$^{-3}$, with energy of 100 KeV (FIG. 7A) by using an implantation technique. Then, it is heated for about 10 hours in an atmosphere at 1200° C. thereby to form an N type diffusion layer (N well) with about 5μ in depth and its surface concentration $1 \times 10^{16}$ cm$^{-3}$ (FIG. 7B). Further, through PEP (photo engraving process) and boron diffusion (or boron implantation) a P+ diffusion layer is formed on a desired surface portion of the N well (FIG. 7C). The just-mentioned manufacturing method is applied to the case where the memory cell shown in FIG. 3 is of N channel type. In the case of the P-channel type, boron is implanted onto an N type substrate to form a P well. Then, phosphor is diffused or implanted onto a part of the surface of the P well. Additionally, the following method is also usable. An N type epitaxial layer with the impurity concentration approximate to that of a substrate is formed on the P type substrate with the impurity concentration of $N_A = 2 \times 10^{15}$ cm$^{-3}$, for example. See FIG. 8A. On the wafer thus formed, an SiO$_2$ layer is formed by thermal oxidation or chemical vapor deposition method. Then, the PEP and etching techniques are applied to the layers to leave a necessary portion of the epitaxial layer. Then, by the thermal oxidation and the PEP techniques, a P+ layer is formed on a part of the epitaxial layer surface (FIG. 8B). In the case of the N type substrate, a P type epitaxial layer is formed and then an N+ layer is formed on a part of the epitaxial layer. For either of the methods used, the respective terminals of the control circuit are connected to an integration circuit including the memory cells shown in FIG. 3 by means of Al electrodes.

Figure 9:
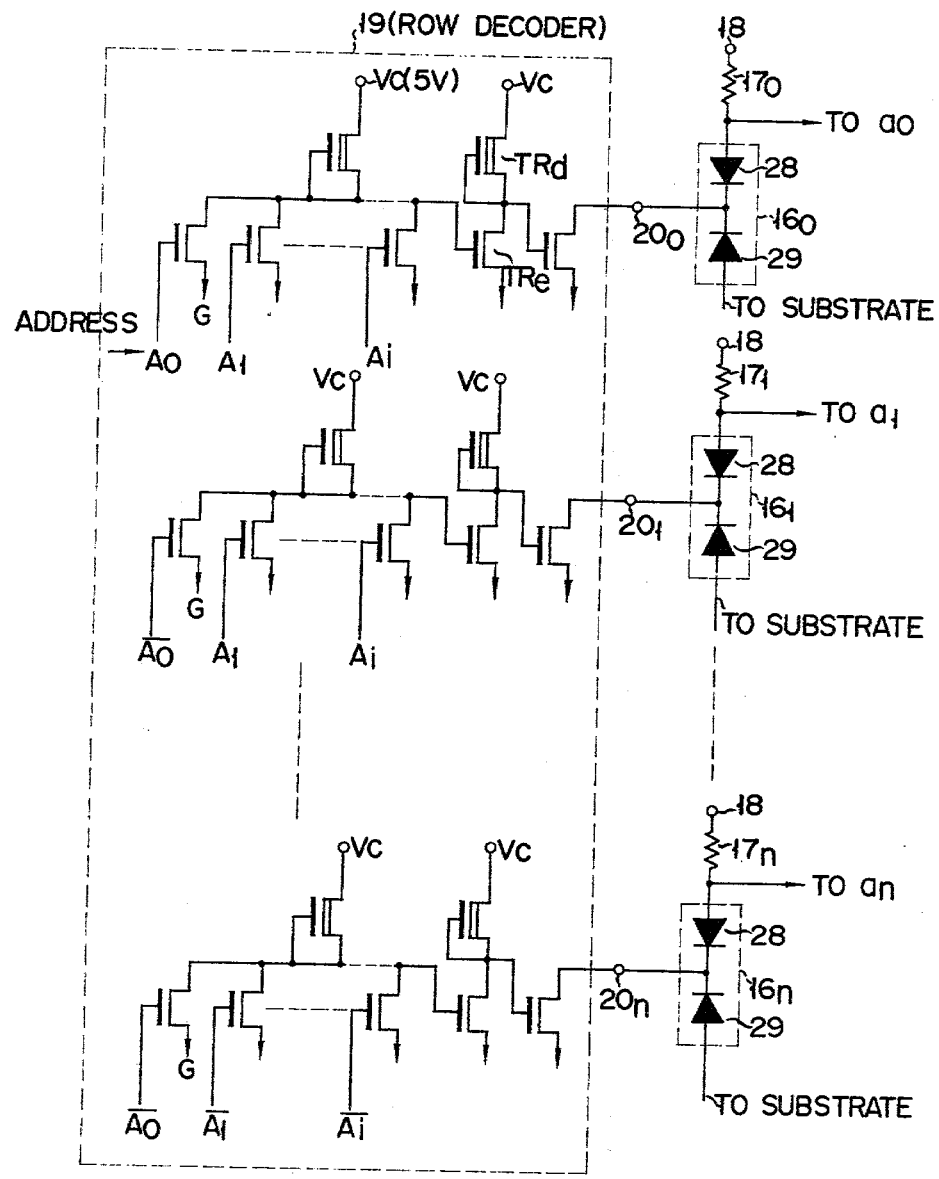
FIG. 9 shows a circuit diagram illustrating the connection of the row decoder shown in FIG. 3 to the control circuits.

FIG. 9 shows a connection between the circuit of the row decoder 19 and the control circuits $16_o$ to $16_n$. For denotation of the respective parts, reference symbols used in FIG. 3 are used for simplicity of illustration. A symbol TRd designates a depression type MOS and TRe designates an enhancement type MOS.

Figure 4B:
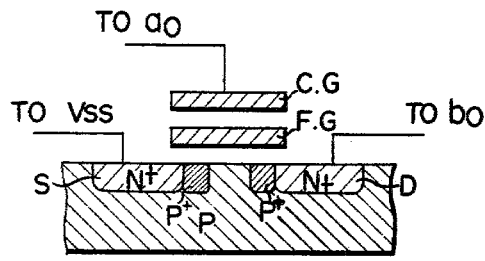
Figure 10:
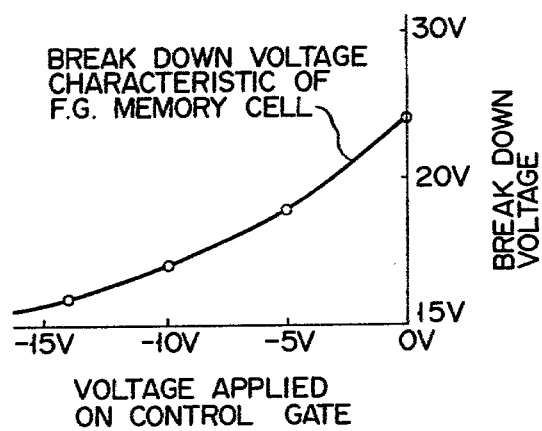
FIG. 10 shows a graph illustrating an example of a breakdown voltage of a floating gate type FET shown in FIG. 4A.

As described above referring to FIG. 4A and FIG. 6, in the erase cycle, +40 V (Vss) is applied to the source of the memory cell to cause a breakdown in the memory cell illustrated in FIG. 4A. However, the breakdown is also caused in a manner that P+ regions are provided adjacent the drain and source respectively as shown in FIG. 4B and a voltage (Vss) lower than +40 V may be applied to the source of the memory cell. FIG. 10 shows, with a breakdown characteristic curve, how the breakdown voltage changes depending on a relation between a voltage applied to the drain of the memory cell of FGTr and a voltage applied to the control gate CG. In the memory system shown in FIG. 3, it is frequently desired not only to erase all the memory cells simultaneously but also to erase all the memory cells connected to a selected column line or connected to a selected row line. In this case, use of the memory cell with the structure shown in FIG. 4B may attain its object.

Erasing of only the data in the memory cells coupled with a single column line will be described. Assuming now that the structure of the memory cell used is as shown in FIG. 4B, the power supply source Vss is always at ground potential, and only the data of the memory cells coupled with the column line $b_o$ are erased. In FIG. 3, the transistor $7_o$ is made selectively conductive by the column decoder 21. Then, −40 V is applied to the control gates of the memory cells $a_ob_o, \ldots a_nb_o$ by applying −40 V to the control terminal 18 and +25 V is applied to the drains of the cells. Upon the application of the voltage, a breakdown takes place in the memory cells $a_ob_o, \ldots a_nb_o$, so that pairs of electrons and holes are produced in the memory cells $a_ob_o, \ldots a_nb_o$, thereby to inject holes into the floating gates FG of the cells $a_ob_o$. Accordingly, the data stored in the memory cells $a_ob_o, \ldots a_nb_o$ are erased. The memory cells belonging to the column lines $b_1$ to $b_m$ is rendered nonconductive. Accordingly, no breakdown occurs in the memory cells and therefore the contents in the memory cells belonging to column lines $b_1$ to $b_m$ are not erased.

Figure 11:
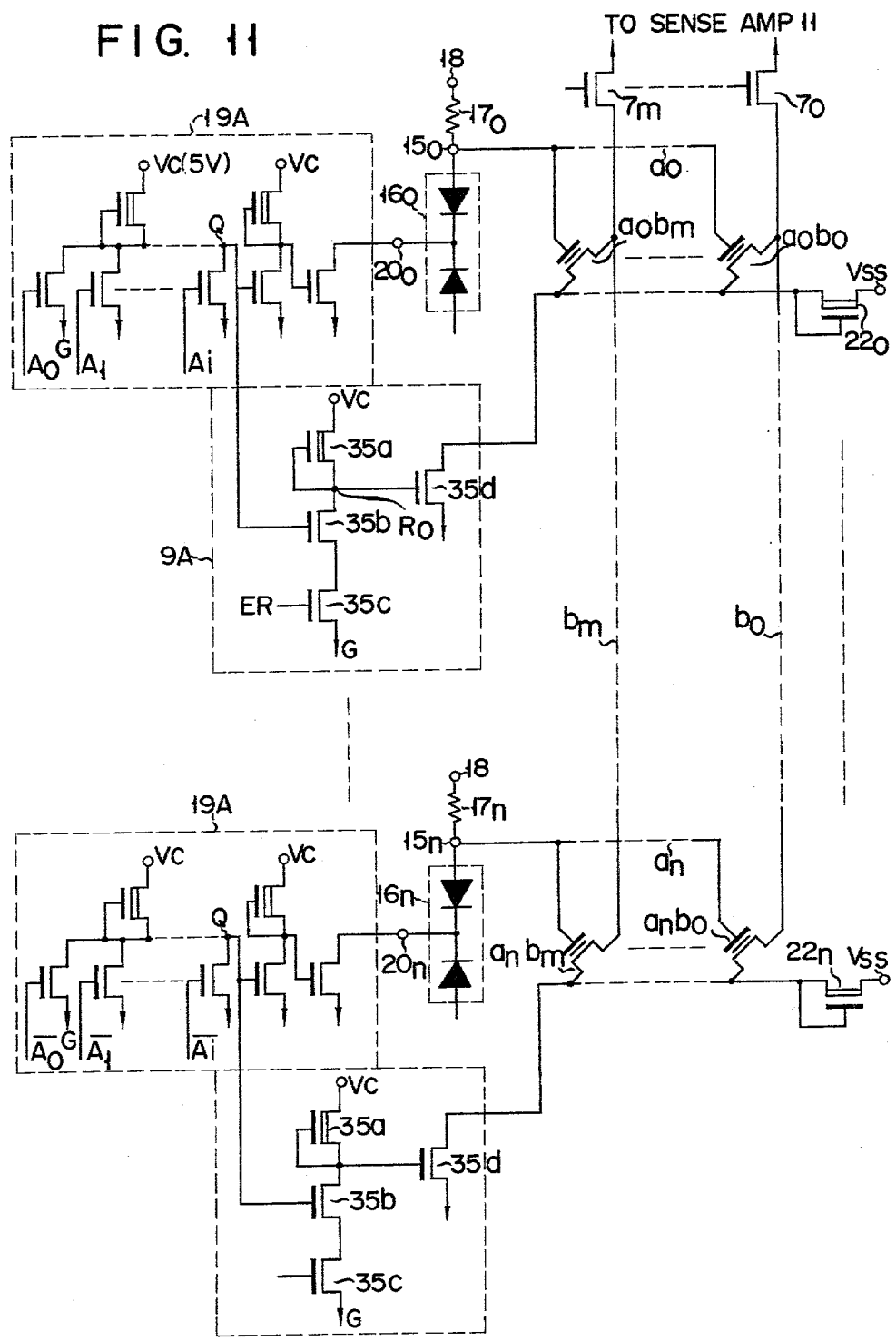
FIG. 11 shows a circuit diagram of another embodiment capable of erasing data in the memory cells arranged in a row direction.

The erasing of the contents of only the memory cells belonging to one row line will be described with reference to FIG. 11. As shown in FIG. 11, the gates of the memory cells $a_ob_o, \ldots a_ob_m$ belonging to a row line $a_o$, for example, are connected to the terminal $15_o$ and the sources of the memory cells are connected to the power supply source Vss through a transistor $22_o$. Between the output terminal Q of a unit row decoder 19A and the common sources of the cells $a_ob_o$ to $a_ob_m$ is connected an erase circuit 9A. The drains of the memory cells $a_ob_o, \ldots a_nb_o$ belonging to the column line $b_o$, for example, are commonly connected to the column line $b_o$ which is further connected through the transistor $7_o$ to the sense amplifier 11 (see FIG. 3). The erase circuit 9A includes a depletion type transistor 35a, and enhancement type transistors 35b to 35d. The gate of the transistor 35b is connected to the output terminal Q of the unit row decoder 19A and the drain of the transistor 35d is connected to the sources of the memory cells $a_ob_o, \ldots a_ob_m$ commonly connected to the row line $a_o$. In FIG. 11, assume that all the memory cells belonging to the row line $a_o$ are selectively erased while the memory cells belonging to the remaining row lines are not erased. On this assumption, the output terminal Q of the unit row decoder 19A coupled with the row line $a_o$ is logical '1'.

Further, the erase signal ER of the erase circuit 9A is logical '1'. When ER='1', a node Ro between the transistors 35a and 35b is logical '0', and the transistor 35d is turned off. At this time, the potential of the power supply source Vss is increased to such an extent, for example, +25 V, that the breakdown takes place in the memory cells $a_0b_0, \ldots a_0b_m$. At this time, $-40$ V has already been applied through the control terminal 18 to the gates of the memory cells $a_0b_0, \ldots a_0b_m$ belonging to the row line $a_0$. Accordingly, a breakdown takes place in the source side of the memory cells $a_0b_0, \ldots a_0b_m$, thus resulting in erasure of data. With respect to the row line not selected, for example, $a_m$ since the output point Q of another unit row decoder 19A is '0', the transistor 35b is turned off and the output Ro becomes '1'. Accordingly, the transistor 35d is turned on and the drain potential of the transistor 35d becomes approximately '0'. Therefore, a breakdown does not take place in the memory cells $a_nb_0, \ldots a_nb_m$ so that the data stored therein are not erased.

Figure 12A:
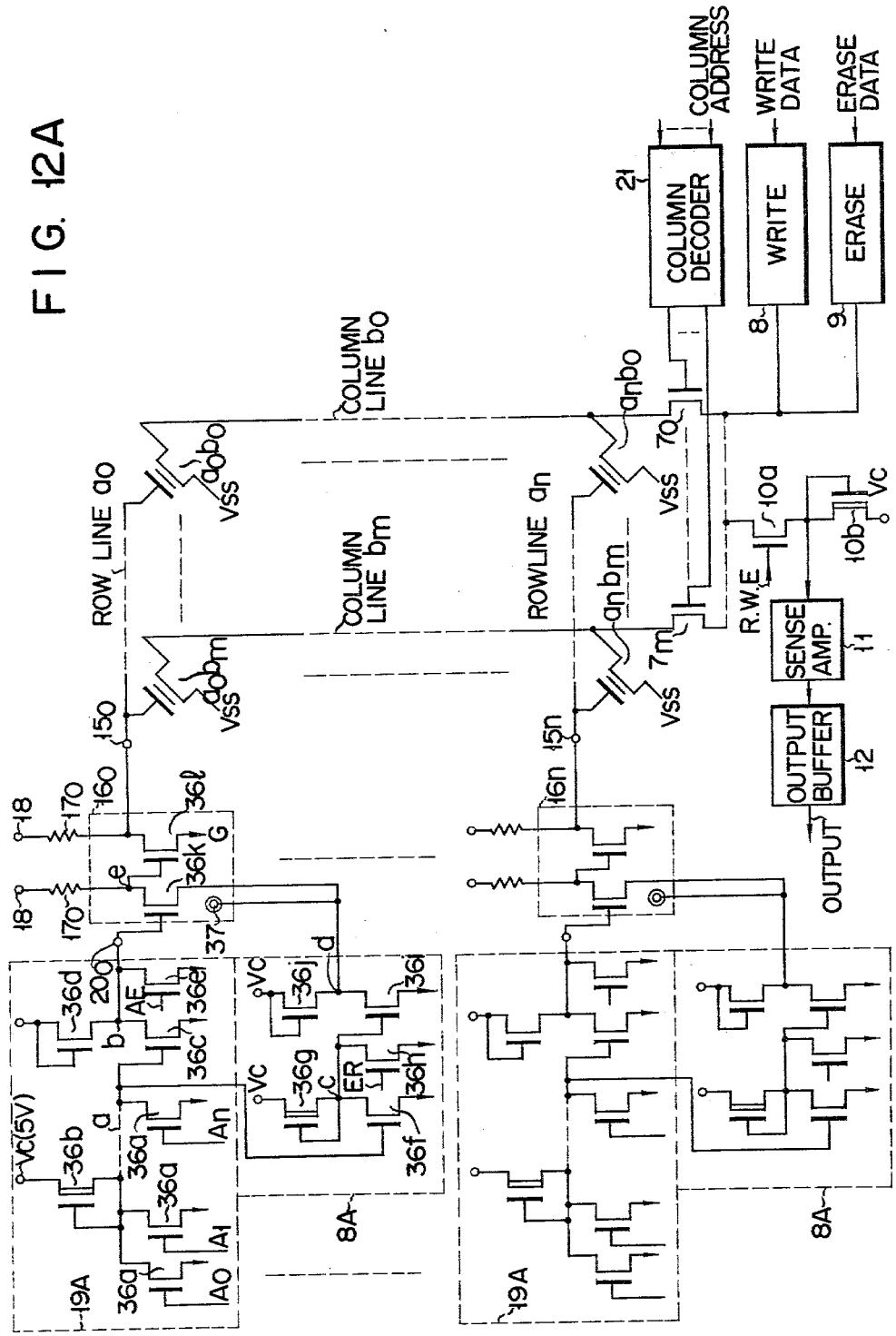
FIG. 12A shows a circuit diagram of another embodiment capable of erasing data in a single memory cell selected.

FIG. 12A shows another embodiment of the nonvolatile memory system according to the invention. This embodiment can simultaneously erase the contents of all the memory cells of the memory system, of the memory cells belonging to only one row line, of the memory cells belonging to one column line, or of only one memory cell selected. Accordingly, this embodiment can rewrite a part or all of the contents of the memory cells of the memory system.

Figure 12B:
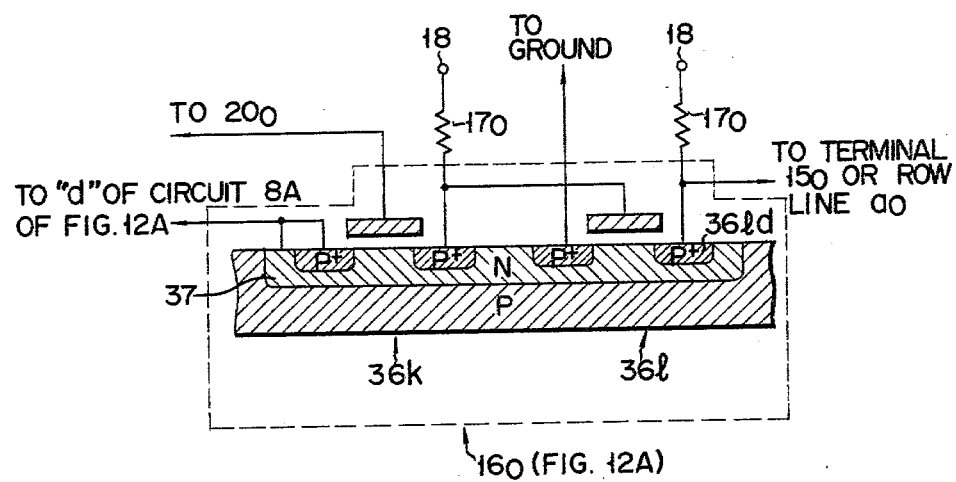
FIG. 12B shows a cross sectional view of a semiconductor element forming a control circuit connected between an output terminal of a row decoder shown in FIG. 12A and a row line.

In FIG. 12A, a unit address decoder 19A includes transistors 36a to 36e, a write control circuit 8A includes transistors 36f to 36j, and a control circuit $16_o$ includes transistors 36k and 36l. The same thing is true for a unit address decoder, a write control circuit, and a control circuit belonging to a row line $a_n$. Of those transistors, the transistors 36b and 36g are of the depression type and the remaining ones are of the enhancement type. In FIG. 12A, a common connection point among the transistors 36a to 36d is designated by a character a; a connection point between the transistors 36c and 36d by a character b; a connection point between the transistors 36f and 36g by a character c; a connection point between the transistors 36i and 36j by d; a connection point between the transistor 36k and a resistor $17_o$ by e. The remaining part of the circuit is the same as that of the circuit shown in FIG. 3, with some exception. For simplicity of explanation, like reference symbols are used to designate like portions in FIG. 3. The source of the transistor 36k is connected to the N-well layer 37 (FIG. 12B). A signal AE, which becomes '1' at the time of simultaneously erasing all the memory cells or the memory cells belonging to one column line, is applied to the gate of the transistor 36e. Further, an erase signal ER, which becomes '1' only at the time of the erase, is applied to the gate of the transistor 36h.

Figure 12C:
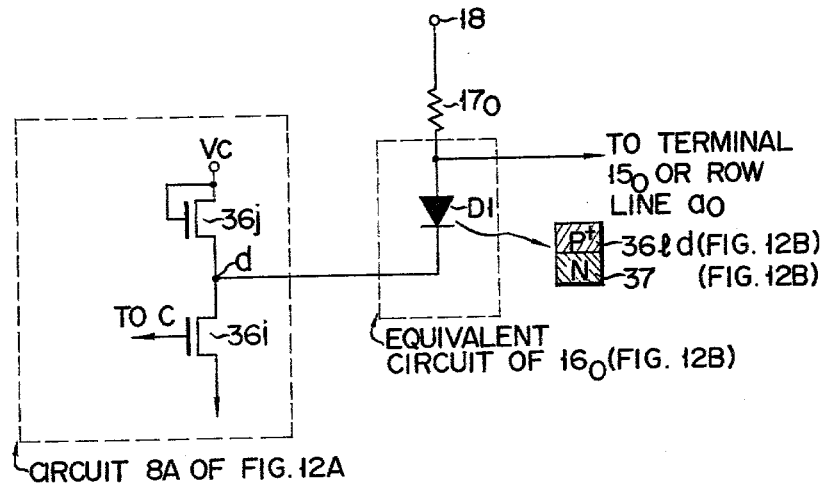
FIG. 12C shows an equivalent circuit of a control circuit shown in FIG. 12B.

The construction of the control circuit $16_o$ shown in FIG. 12A is illustrated in FIG. 12B and the connection of it to other related circuits is illustrated in detail in the drawing, thus omitting the explanation of its details. For a better understanding of the circuit shown in FIG. 12A, an equivalent circuit $16_o$ ($16_1, \ldots 16_n$) in the read and write (program) operations will be described with reference to FIG. 12C. When a positive potential ($+5$ V in the read operation and $+25$ V in the write operation) is applied to the control terminal 18, P-channel transistors 36k and 36l are non-conductive, resulting in the presence of a diode D1 formed by a P+ region 36ld and an N-well 37. This is equivalent to the presence of diode D1 between an output point d between n-channel transistors 36i and 36j and a terminal $15_o$. Accordingly, the potential at the output point c between the transistors 36f and 36g in the circuit 8A becomes "0" to turn off the transistor 36i. At this time, the terminal d is charged by a write voltage +25 V applied to the control terminal 18 through the resistor $17_o$ and the diode D1 and the terminal d has a potential approximate to +25 V. Upon this, the transistor 36j is also turned off. Accordingly, the terminal $15_o$ and the row line $a_o$ become +25 V. The case to select the row line $a_o$ is as mentioned above. In the case where the row line $a_o$ is not selected, the terminal c in the write control circuit 8A becomes logical '1' in level. Accordingly, the transistor 36i is turned on and the charge on the terminal $15_o$ and the row line $a_o$ are discharged through the diode D1, and the terminal $15_o$ and the row line $a_o$ become 0 V in potential.

Explanation will be given of a case where data is written into the memory cell $a_0b_0$ shown in FIG. 12A. In this case, +25 V is first applied to the terminals 18. Since the point d is connected to the N-well 37, logical level '0' or '1' of the N-well 37 is determined depending upon the ON or OFF state of the transistor 36i, that is to say, logical level '0' or '1' at the terminal d. In accordance with logical level state '0' or '1' of the N-well 37, 0 V or 25 V may be applied to the row line $a_o$. Since the example under discussion is the data write operation, ER='0' and AE='0'. Accordingly, when the row line $a_o$ is not selected, that is to say, when the terminal a is '0', c (terminal)='1' and d (terminal)='0', and $a_o$ (row line)='0'. Accordingly, at this time, no data is written into the memory cell $a_0b_0$. When the row line $a_o$ is selected and the output point a in the unit row decoder 19A becomes '1', c (terminal)='0', the transistor 36i is turned off and +25 V applied to the control terminals 18 appears at the terminal d. Therefore, the row line $a_o$ becomes +25 V. At this time, the column line $b_o$ is selected by the column decoder 21 and a write voltage +25 V is applied from the write circuit 8 to the column line $b_o$. Accordingly, electrons are injected into the floating gate FG of the memory cell $a_0b_0$ to perform the write operation. A transistor 10a of which the gate is supplied with read signal, write signal, and erase signal, is connected between the common connection line among the drains of the transistors $7_o, \ldots 7_m$, and the sense amplifier 11. In the write operation, the transistor 10a is turned off.

The data-read will be described below. In this case, a logical level state '1' or '0' of a memory cell is detected by detecting ON or OFF state of the memory cell. A memory cell to which electrons are injected, that is to say, to which data is written, has a high threshold voltage Vth. Accordingly, even if +5 V is applied to the control gate CG of the memory cell, it is not turned on. In the case of a memory cell having no data written or no electrons injected, it is turned on by the application of +5 V. At the time of data-read, the signal AE (see transistor 36e) and the signal ER (see transistor 36h) are '0' and the signal RWE (see transistor 10a) is '1'. Accordingly, the transistor 10a is turned on to permit data appearing on a column line to reach the sense amplifier 11. In this data-read operation, +5 V is applied to the control terminal 18.

When the row line $a_o$ is selected, a (terminal)='1', c (terminal)='0' and d (terminal)='1'. At this time, since the terminal d is connected to the N-well 37, $a_o$ (row line)='1'. If the row line $a_o$ is not selected, a (terminal)='0', c (terminal)='1' and d (terminal)='0'. Accordingly, $a_o$ (row line)='0'. The row line $a_o$ becomes '1' in logical level, and the column line $b_o$ is selected by the column decoder 21. At this time, if electrons are injected into the floating gate of the memory cell $a_o b_o$, the memory cell $a_o b_o$ is turned off, so that the column line $b_o$ is charged to be '1' through the transistor 10b. The logical level '1' is derived through the sense amplifier 11 and the output buffer 12. If electrons are not injected (data is not written) into the floating gate FG of the memory cell $a_o b_o$, the memory cell $a_o b_o$ is turned on, and the charge on the column line $b_o$ is discharged through the memory cell $a_o b_o$ so that the column line $b_o$ becomes logical '0' and the data of the memory cell $a_o b_o$ is derived from the output buffer 12.

The data-erase will be described. The data-erase means that a breakdown is caused in the source or the drain region of the memory cell, holes of the pairs of electrons and holes are injected into the floating gate of the cell by applying a negative voltage to the control gate of the cell, and the electrons already injected into the floating gate at the time of data-write are neutralized. Such an erase is made by applying an erase voltage $-40$ V, for example, to the control terminals 18 and by selecting a column line and a row line.

The explanation to follow is for a case where only the data of a single memory cell selected, for example, $a_o b_o$ is erased. In this case, $-40$ V is applied to the control terminal 18 on the condition that $Vss=0$ V, AE='0', ER='1', RWE='0' (see transistors 36e, 36h and 10a). Then, the row decoder 19 (see FIG. 3) selects the row line $a_o$ to set the row line $a_o$ to $-40$ V. At the same time, the column decoder 21 selects the column line $b_o$ to apply $+25$ V to the column line $b_o$. Under this condition, the row lines other than $a_o$ are kept at 0 V and the column lines other than $b_o$ also are kept at 0 V. As shown in FIG. 10, the drain voltages for causing a breakdown in a memory cell are allowed to be lower as the control gate voltage negatively increases. Accordingly, a breakdown takes place only in the memory cell $a_o b_o$ of which the control gate voltage is $-40$ V and the drain voltage is $+25$ V. Thus only the data of the cell $a_o b_o$ is erased. When $-40$ V is applied to the row line $a_o$, a (terminal)$=5$ V, b (terminal)$=0$ V, and the terminal ER (see transistor 36h) is '1'. Accordingly, c (terminal)='0', and d (terminal)='1', and $+5$ V appears at the terminal d. For this, the N-well 37 is kept at $+5$ V. Because b (terminal)$=0$ V, the transistor 36k of P-channel type is turned on and $+5$ V appears at the terminal e. Accordingly, the transistor 36l is turned off and $-40$ V is applied to the row line $a_o$. If the row line $a_o$ is not selected, a (terminal)$=0$ V and thus the b (terminal)$=+5$ V, turning off the transistor 36k. As a result, the terminal e becomes $-40$ V in potential. Therefore, the transistor 36l is turned on and the row line $a_o$ becomes 0 V in potential. As described above, it is evident that voltages, for example, $-40$ V or $+25$ V, may selectively be applied to the row lines and the column lines. Therefore, data in an arbitrary memory cell is erasable.

An explanation will be given of how the data stored in all the memory cells belonging to a single row line are erased. As described above, $-40$ V or 0 V may selectively be applied to the row lines. A row line to which the memory cells desired to be erased are connected is kept at $-40$ V and the remaining row lines are kept at 0 V. Under this condition, if address signals to turn on all the transistors $7_o$ to $7_m$ are applied to the column decoder 21, $+25$ V is applied to the column lines $b_o$ to $b_m$. Upon the application of $+25$ V, a breakdown takes place in only the memory cells connected to the row line to which $-40$ V is selectively applied. As a result, only the contents of the memory cells connected to a single row line are erased. Unlike the above-mentioned method, by setting the power supply source Vss to $+25$ V, the data of the memory cells belonging to a row line to which $-40$ V is selectively applied may be erased.

Explanation will be given referring to FIG. 12A of how the data of all the memory cells connected to a single column line are erased. In this erase operation, the signal AE (transistor 36e) and the signal ER (transistor 36h) are rendered logical '1'. At this instance, c (terminal)$=0$ V, d (terminal)$=+5$ V, b (terminal)$=0$ V, e (terminal)$=+5$ V, and $a_o$ (row line)$=-40$ V. At this time, $-40$ V of course is applied to the control terminal 18. Under this condition, if the column line $b_o$ is selected by the column decoder 21, and $+25$ V is applied to only the column line $b_o$, a breakdown takes place in only the memory cells $a_o b_o$ to $a_n b_o$ connected to the column line $b_o$, thereby to erase the data.

Under a condition that $-40$ V is applied to all the row lines, when address signals to turn on all the transistors $7_o$ to $7_m$ are applied to the column decoder 11, all the memory cells of the memory system are simultaneously erased. Additionally, it is apparent that, when the row lines $a_o$ to $a_n$ are sustained at $-40$ V, if the power supply source Vss is set to $+40$ V, the data of all the memory cells are erased. In this case, the breakdown takes place in the source sides of the memory cells.

Figure 13:
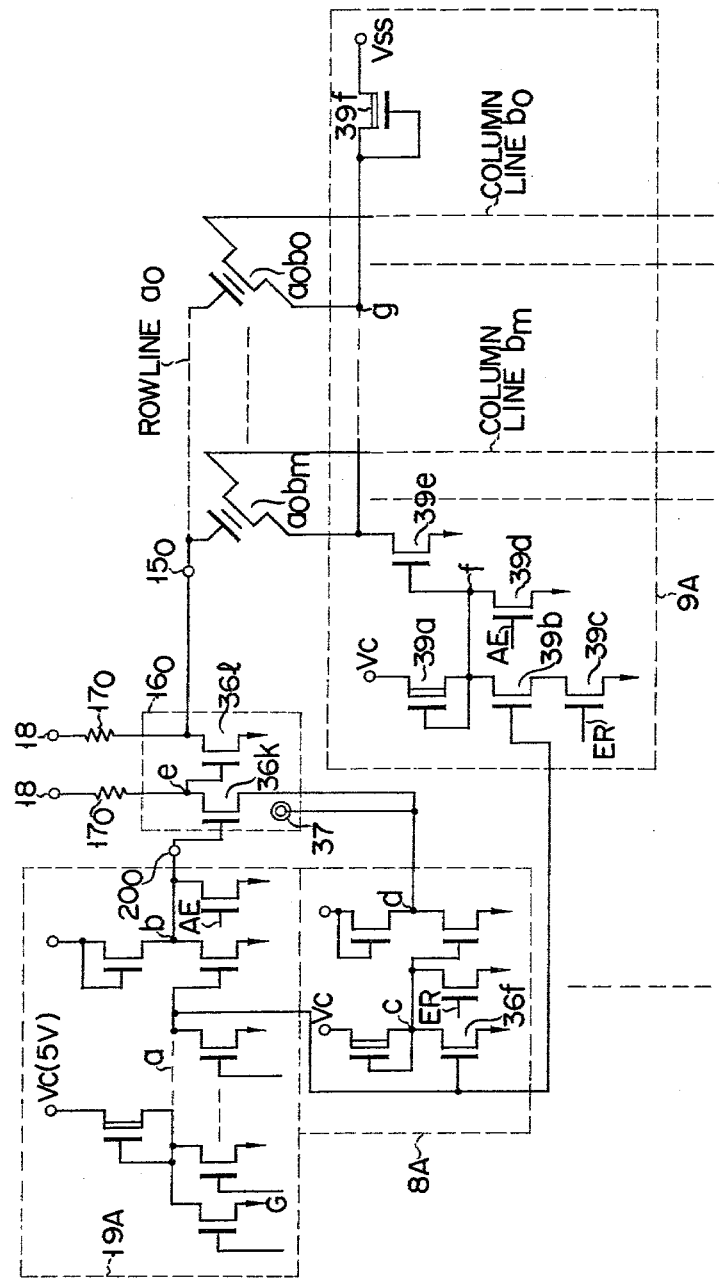
FIG. 13 shows a circuit diagram of a modification shown in FIG. 11 which is capable of erasing data in the memory cells arranged in a row direction.

FIG. 13 shows still another embodiment of the memory system according to the invention. In this embodiment, an erase circuit 9A to erase the data of only all the memory cells belonging to the row line $a_o$ is additionally provided in the circuit connected to the row line shown in FIG. 12A, for example, the row line $a_o$. Accordingly, necessary portions alone are illustrated. The erase circuit 9A includes transistors 39a to 39f connected as shown. The gate of the transistor 39b is connected to the gate of the transistor 36f and transistor 39f is connected between the source of the memory cell $a_o b_o$ and the power supply source Vss. The signal ER (erase) is applied to the gate of the transistor 39c and the signal AE before described is supplied to the gate of the transistor 39d. The connection point between the transistors 39d and 39e is designated by f and the connection point between the source of the memory cell $a_o b_o$ and the transistor 39f, is denoted as g.

In FIG. 13, under a condition that AE (signal)='0' and ER (signal)='1', the potential of the control terminals 18 is set to $-40$ V and the power supply source Vss is set to $+40$ V. Under this condition, one row line selected, for example, $a_o$, may be set at $-40$ V, as mentioned above referring to FIG. 12A. When the row line $a_o$ is selected, the terminal a is '1' and the terminal f is '0'. Accordingly, the transistor 39e is turned off. Because of $Vss=+40$ V, $+40$ V is applied to the terminal g. Therefore, the breakdown takes place in all the memory cells $a_o b_o$, ... $a_o b_m$ connected to the row line $a_o$. Accordingly, the data in those memory cells belonging to the row line $a_o$ are erased. When the row line $a_o$ is not selected, that is to say, the terminal a is '0', the terminal f is equal to '1', so that the transistor 39e is turned on and therefore the terminal g becomes 0 V in potential. As a consequence, the data of the memory cells $a_0b_0, \ldots a_0b_m$ are not erased.

Figure 14:
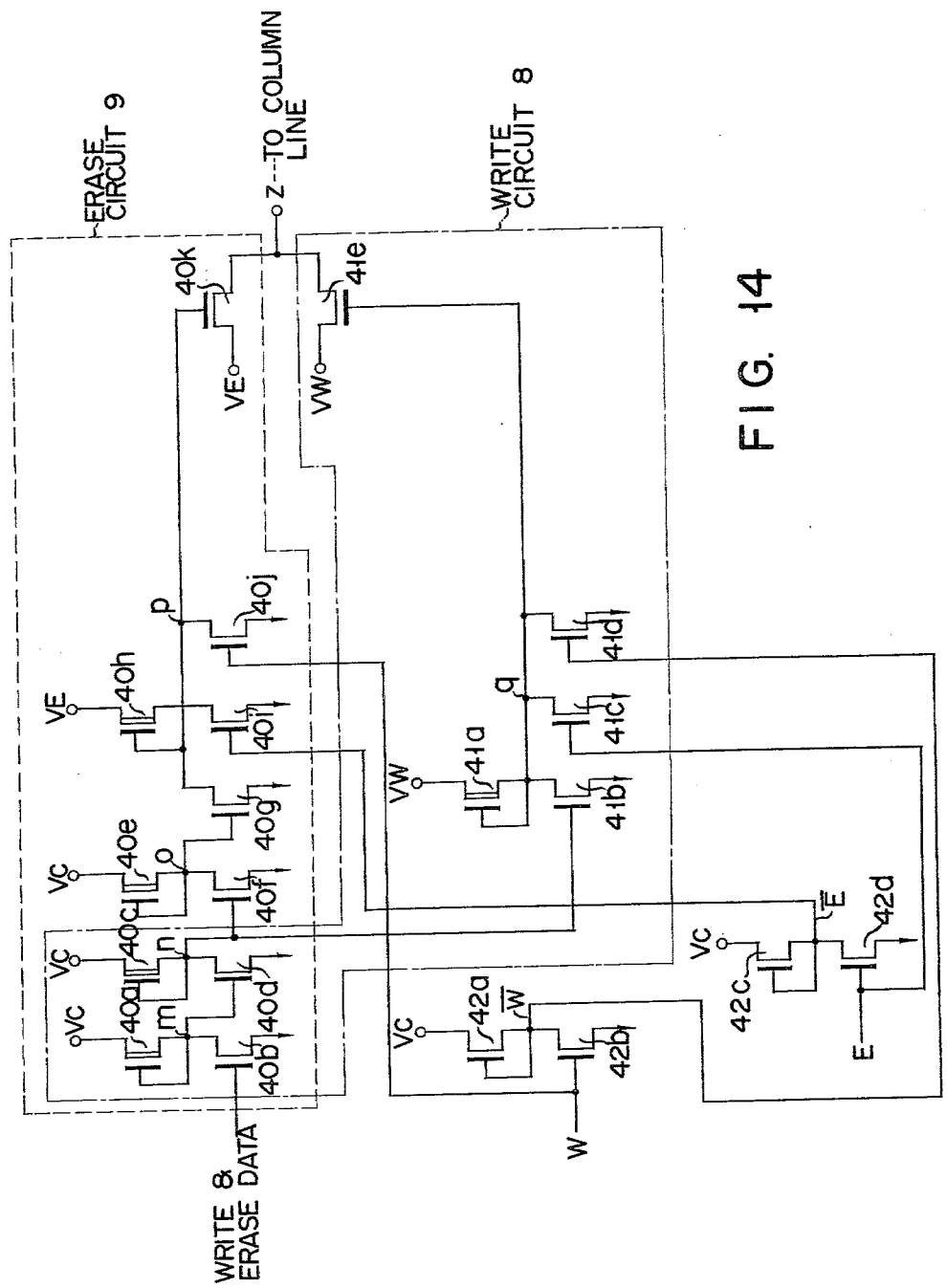
FIG. 14 shows a circuit diagram illustrating the details of an erase circuit and a write circuit shown in FIG. 12A.

Examples of the write circuit 8 and erase circuit 9 shown in FIG. 12A are shown in FIG. 14. In FIG. 14, the erase circuit 19 is illustrated including transistors 40a to 40k connected as shown, and the write circuit 8 is illustrated including transistors 40a to 40d, and 41a to 41e connected as shown. The write circuit 8 and the erase circuit 9 are mutually connected by a circuit including transistors 42a to 42d connected as shown. The connection point between the transistors 40a and 40b is denoted as m; the connection point between the transistors 40c and 40d as n; the connection point between the transistors 40e and 40f as o; the connection point between transistors 40h and 40i as p; and the connection point between the transistors 41a and 41b as q. Write data or erase data is applied to the gate of the transistor 40b and an erase voltage VE is applied to one end of the drain source path of the transistor 40k. A write voltage VW is applied to one end of the drain-source path of the transistor 41e. The other ends of the drain-source paths of the transistors 40k and 41e are connected to a terminal z. The gate of the transistor 42b is supplied with a write signal W. An inverting signal $\overline{W}$ of the write signal W is derived from the connection point between the transistors 42a and 42b. An erase signal E is applied to the gate of the transistor 42d.

In reference to FIG. 14, a state that electrons are injected into the floating gate of a memory cell (FIG. 12A) is denoted as '0' and a state that no electron is injected thereinto is denoted as '1'. In reading out data, if electrons are injected into the floating gate of a memory cell selected, the memory cell is in OFF state, and the column line is charged to be '1', as mentioned above relating to FIG. 12A. The sense amplifier 11 (FIG. 12A) is provided to detect the '1' state and to produce an output '0'. Accordingly, it can read out a '0' state of a memory cell (a state that electrons are injected into the memory cell). When no electron is injected into a memory cell, the memory cell is turned on and charge on the column line is discharged so that the column line becomes a state of '0'. The sense amplifier 11 detects the '0' state to produce '1'. Accordingly, it can detect the '1' state of a memory cell (a state that no electron is injected into the memory cell).

In the erase circuit 9 shown in FIG. 14, in order to erase the contents of a memory cell, that is, to return a '0' state (electrons are injected) to a '1' state (none of the electrons is injected), and the following settings are first made: VE = +30 V (transistor 40k), W (write signal) = '0' (transistor 42b), and E (erase signal) = '1' (transistor 42d). Then, '1' is inputted as erase data so that the voltage VE (+30 V) appears at the terminal P and the transistor 40k is turned on. Accordingly, VE−$V_{TH}$ ($V_{TH}$ is the threshold voltage of the transistor 40k) appears at the terminal z, and +25 V is applied to the column lines selected. As a result, the breakdown takes place in the memory cells connected to the column lines selected, so that the '0' state of the memory cells becomes the '1' state. At this point, the erasing operation is completed.

Then, when '0' is inputted as erase data to the transistor 40b, the terminal p becomes '0' state and the transistor 40k is turned off. Therefore, the voltage VE is not supplied to the terminal g and the column lines. As a result, the logical states '1' and '0' of the memory cells connected to those column lines remains unchanged. In the above erasing operation, the terminal q becomes '0' in logical state and the transistor 41e is turned off. Accordingly, the write circuit 8 is little affected.

In writing data into the memory cells, or in programming the memory system, the following settings are first made: VW = +25 V (transistors 41e and 41a), W = '1' and E = '0'. Under this condition, when write data is '0' (transistor 40b), the terminal q becomes +25 V (VW) and the transistor 41e is turned on. Accordingly, the terminal z has the potential VW−$V_{TH}$ ($V_{TH}$ is the threshold voltage of the transistor 41e), so that the selected column lines have potential approximate to 20 V. As a result, data-write is performed for the selected memory cells. In other words, the state of the selected memory cells becomes '0'. When the write data is '1' (transistor 40b), the potential of the terminal q becomes 0 V so that the transistor 41e is turned off. The result is that the write voltage VW is not applied to the column line, nothing is written into the memory cells belonging to the column line, and these memory cells are sustained at '1' state.

Figure 15:
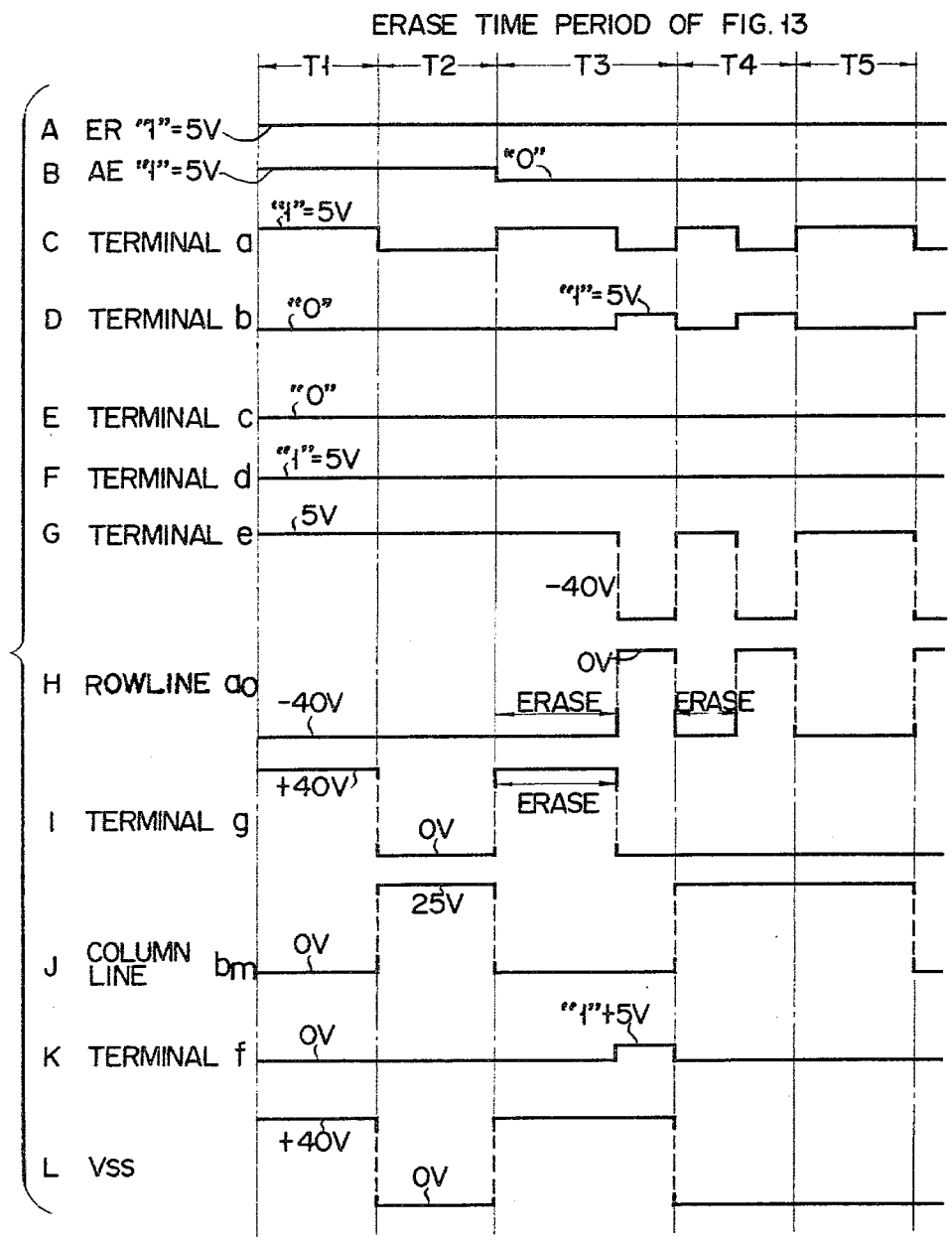
FIG. 15, consisting of A–L, shows a set of waveforms, illustrating a relation among the signals at the respective portions during respective erasing periods in the circuit shown in FIG. 13.

FIG. 15 shows a set of waveforms of voltages at the respective portions when data in a memory cell or cells of the memory system according to the invention is erased. During period T1 the data in all the memory cells of the memory system are erased. During a period T2 only the contents of all the memory cells belonging to one column line selected are erased. During a period T3 only the data in the memory cells belonging to one row line selected are erased with 40 V of the power supply source Vss. During a period T4 only the data of all the memory cells belonging to one row line are erased with 0 V of Vss and 25 V applied to the column line. During a period T5 the data in one memory cell selected is erased.

In the above mentioned embodiments, the '0' state of a memory cell represents a case where electrons are injected into the floating gate of a memory cell while the '1' state represents a case where no electron is injected thereinto. Those representations for the respective states are interchangeable to each other. Further, in the embodiment shown in FIG. 14, the erase operation is made when the erase data is '1', but the embodiment may be modified into one in which the erase operation is made when the erase data is '0'.

What is claim is:

1. An electrically alterable nonvolatile memory system having memory cells each including one transistor comprising:

a plurality of nonvolatile memory cells arranged in a matrix array of rows and columns, and each including one transistor;

a plurality of column lines coupled with one of the ends of the source-drain paths of the memory cells arranged in respective columns of said array;

a voltage supply source coupled commonly with the other ends of the source-drain paths;

a column decoder for selecting a column line;

a plurality of row lines each connected commonly to the control gates of the memory cells arranged in respective rows of said array;

a row decoder for selecting a row line and having a plurality of output terminals;

a control terminal coupled commonly to said respective row lines for applying a voltage with a different level corresponding to data-read, data-write or data-erase of at least one of said memory cells;

a plurality of control circuits each being coupled (a) with a corresponding one of said row lines, (b) with one of said outputs terminals of said row decoder corresponding to said corresponding row line and (c) with said control terminal, for applying to a corresponding row line a voltage having a prescribed level corresponding to a voltage level applied to said control terminal;

whereby said data-write, data-read or data erase is made for at least one of said memory cells by controlling at least the voltage level applied to said control terminal.

2. An electrically alterable nonvolatile memory system according to claim 1, in which said nonvolatile memory cell includes an only one transistor.

3. An electrically alterable nonvolatile memory system according to claim 1, in which said nonvolatile memory cell includes a source, a drain, a floating gate and a control gate.

4. An electrically alterable nonvolatile memory system according to claim 3, in which said nonvolatile memory cell further includes a semiconductor region with a higher concentration than the impurity concentration of a substrate and with the same conductivity type as that of the substrate, and disposed adjacent at least one of said source and drain.

5. An electrically alterable nonvolatile memory system according to claim 1, in which said nonvolatile memroy cell is a metal-nitride-oxide semiconductor type field effect transistor.

6. An electrically alterable nonvolatile memory system according to claim 1, in which said control terminal receives a positive voltage with a first level upon the data-read, a positive voltage with a second level higher than the first level upon the data-write, and a negative voltage with a third level upon the data-erase.

7. A memory system according to claim 1, in which said control terminal is connected to said respective control circuits through a resistor.

8. An electrically alterable nonvolatile memory system according to claim 1, in which said memory cell includes a substrate of a first conductivity type and in which said control circuit includes (a) a first semiconductor region of a second conductivity type formed on the substrate of said memory cell, and (b) a second semiconductor region of the first conductivity type formed on the surface of said first semiconductor region, said first semiconductor region being connected to a corresponding output terminal of said row decoder, and said second semiconductor region being coupled with a corresponding row line and said control terminal.

9. An electrically alterable nonvolatile memory system according to claim 1, in which said memory cell includes a substrate of a first conductivity type and in which each of said control circuits includes a bipolar transistor which is formed on said substrate of said memory cell and includes a base region of a second conductivity type, and emitter and collector regions with the first conductivity type, said base region being connected to a corresponding output terminal of said row decoder, and said emitter being coupled to a corresponding row line and said control terminal.

10. An electrically alterable nonvolatile memory system according to claim 1, including a write control circuit coupled with said row decoder and in which said memory cell includes a substrate of a first conductivity type and in which each of said control circuits includes a write control circuit; a semiconductor region of a second conductivity type formed on said substrate of said memory cell; and first and second MOS-FETs of first conductivity type channel formed in said semiconductor region; the gate of said first MOS-FET being connected to a corresponding output terminal of said row decoder; the drain of said first FET being connected to said control terminal and to the gate of said second MOS-FET; the source of said first FET being coupled with said semiconductor region of the second conductivity type and with an output terminal of said write control circuit coupled with said row decoder; and said second MOS-FET being connected at the drain to said control terminal and to a row line corresponding to the output terminal of said row decoder, and at the source to a ground point.

11. An electically alterable nonvolatile memory system according to claim 1, in which said column lines are connected commonly to each other through transistors each selectable by an output signal from said column decoder, said commonly connected point being coupled with a write control circuit, an erase control circuit and a sense amplifier for detecting data read out from said memory cells.

12. An electrically alterable nonvolatile memory system according to claim 11, in which said sense amplifier is connected to said commonly connected point through a transistor which is turned off upon the data-write and the data-erase, and is turned on upon the data-read.

13. An electrically alterable nonvolatile memory system according to claim 1, in which the free ends of said column lines are commonly connected to each other through transistors which each are controlled in ON-OFF operation by an output signal from said column decoder; said common connected point is supplied with an output signal from an erase control circuit controlled by input erase data; and the data-erase of said memory cells is controlled responsive to said input erase data.

14. An electrically alterable nonvolatile memory system according to claim 1, in which said row decoder further includes a plurality of write control circuits, each write control circuit being coupled with said row decoder and a corresponding control circuit in order that each write control circuit receives a corresponding output signal of said row decoder and apply its output signal to a corresponding control circuit; upon the data-write and the data-read for selected memory cells, a voltage with given level is applied to a selected row line through said row decoder, said write control circuit, and said corresponding control circuit; and, upon the data-erase, a voltage with given level is applied to a selected row line through said row decoder and said corresponding control circuit.

15. An electrically alterable nonvolatile memory system according to claim 1, in which said column lines are commonly connected to each other through MOS transistors which are turned on and off in accordance with the output signal from said column decoder;

an erase control circuit;

said commonly connected point is supplied with an output signal from a write control circuit controlled by input write data, and an output signal from said erase control circuit controlled by input erase data;

said erase control circuit includes a first MOS transistor which is coupled at the gate with an erase signal, at the drain with an erase voltage and the source with said commonly connected point, a first circuit which receives write or erase data and produces an output signal corresponding to the received data, and a second circuit which is coupled between the output terminal of said first circuit and the gate of said first MOS transistor, said second circuit applying a gate signal to the gate of said first MOS transistor for rendering the same transistor conductive when said first circuit receives said erase data, thereby to apply to a selected column line said erase voltage applied to the drain of said first MOS transistor;

said write control circuit includes a second MOS transistor which is coupled at the gate with a write signal, at the drain with a write voltage, and at the source with said commonly connected point, said first circuit, and a third circuit which is coupled between said output terminal of said first circuit and the gate of said second MOS transistor, said third circuit applying a gate signal to the gate of said second MOS transistor for rendering the same transistor conductive when said first circuit receives said write data, thereby to apply to a selected column line said write voltage applied to the drain of said second MOS transistor;

said second circuit further includes a third transistor for rendering said first MOS transistor non-conductive when receiving a write command signal; and said third circuit further includes a fourth MOS transistor for rendering said second MOS transistor nonconductive when receiving an erase command signal.

* * * * *